US008519744B2

(12) United States Patent
Clemens

(10) Patent No.: US 8,519,744 B2
(45) Date of Patent: Aug. 27, 2013

(54) METHOD OF UTILIZING DUAL COMPARATORS TO FACILITATE A PRECISION SIGNAL RECTIFICATION AND TIMING SYSTEM WITHOUT SIGNAL FEEDBACK

(75) Inventor: Steven Thomas Clemens, Carson City, NV (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 13/170,443

(22) Filed: Jun. 28, 2011

(65) Prior Publication Data
US 2013/0002305 A1     Jan. 3, 2013

(51) Int. Cl.
*H03K 5/153*     (2006.01)
(52) U.S. Cl.
USPC .................................. 327/74; 327/75; 327/76
(58) Field of Classification Search
USPC ...................................................... 327/74–76
See application file for complete search history.

(56) References Cited

U.S. PATENT DOCUMENTS

| | | | | |
|---|---|---|---|---|
| 3,652,898 A | * | 3/1972 | Steeves | 361/86 |
| 3,683,284 A | * | 8/1972 | Mueller | 327/70 |
| 3,688,128 A | * | 8/1972 | Van Essen et al. | 327/75 |
| 4,017,747 A | * | 4/1977 | Sheng | 327/76 |
| 4,480,200 A | * | 10/1984 | Tan et al. | 327/79 |
| 4,504,959 A | * | 3/1985 | Heckenbach | 375/257 |
| 4,529,892 A | * | 7/1985 | Reilly et al. | 327/75 |
| 4,859,873 A | * | 8/1989 | O'Shaughnessy et al. | 327/74 |
| 4,883,128 A | * | 11/1989 | O'Neall et al. | 172/430 |
| 5,103,171 A | * | 4/1992 | Petersen | 324/207.23 |
| 5,185,684 A | * | 2/1993 | Beihoff et al. | 361/45 |
| 5,208,542 A | * | 5/1993 | Tennies et al. | 324/544 |
| 5,280,162 A | * | 1/1994 | Marwin | 235/462.31 |
| 5,514,987 A | * | 5/1996 | Ramirez | 327/74 |
| 5,539,340 A | * | 7/1996 | Van Leeuwen et al. | 327/74 |
| 5,856,750 A | * | 1/1999 | Koseki | 327/72 |
| 5,912,593 A | | 6/1999 | Susak et al. | |
| 5,963,079 A | * | 10/1999 | Hoang | 327/512 |
| 6,111,437 A | * | 8/2000 | Patel | 327/74 |
| 6,121,806 A | * | 9/2000 | Kono et al. | 327/205 |
| 6,177,815 B1 | * | 1/2001 | Baumgartner et al. | 327/76 |
| 6,232,768 B1 | * | 5/2001 | Moody et al. | 324/207.12 |
| 6,288,552 B1 | * | 9/2001 | Palmgren | 324/505 |
| 7,282,965 B2 | * | 10/2007 | Hatooka et al. | 327/80 |
| 7,382,167 B1 | * | 6/2008 | Umminger et al. | 327/76 |

(Continued)

OTHER PUBLICATIONS

Danish Patent and Trademark Office Search Report from DO Application No. 201270357 dated Feb. 8, 2013.

*Primary Examiner* — Kenneth B. Wells
(74) *Attorney, Agent, or Firm* — Cooper Legal Group, LLC

(57) ABSTRACT

A method and an associated apparatus for a signal rectification and timing circuit. A variable amplitude input signal is generated. An upper threshold level is determined and a lower threshold level is determined. The variable amplitude input signal and the upper threshold level are input into a first comparator. The variable amplitude input signal and the lower threshold level are input into a second comparator. A first digital output signal is generated in the first comparator using a hysteresis circuit and a second digital output signal is generated in the second comparator using a hysteresis circuit. The first digital output signal and the second digital output signal are input into a logic array. A digital level pulse output signal is generated in the logic array that has a digital transition where the variable amplitude input signal passed through a threshold level.

8 Claims, 3 Drawing Sheets

(56) References Cited

U.S. PATENT DOCUMENTS

| | | | | |
|---|---|---|---|---|
| 7,394,232 B2 * | 7/2008 | Hendrix et al. | | 323/272 |
| 7,519,468 B2 * | 4/2009 | Orr et al. | | 701/433 |
| 7,839,189 B2 * | 11/2010 | Maltione et al. | | 327/143 |
| 8,031,045 B1 * | 10/2011 | Tsvey | | 340/3.8 |
| 8,044,667 B2 * | 10/2011 | Cortigiani et al. | | 324/522 |
| 8,102,135 B2 * | 1/2012 | Takeuchi | | 318/599 |
| 8,118,487 B2 * | 2/2012 | Goh et al. | | 374/185 |
| 2010/0214141 A1 | 8/2010 | Koyama | | |

* cited by examiner

METHOD OF UTILIZING DUAL COMPARATORS TO FACILITATE A PRECISION SIGNAL RECTIFICATION AND TIMING SYSTEM WITHOUT SIGNAL FEEDBACK

BACKGROUND OF THE INVENTION

1. Field of the Invention

The present invention relates to comparator circuits and, more particularly, to a method and an associated circuit and of using two comparators to separately compare an input signal of variable amplitude with an upper threshold value and a lower threshold value.

2. Discussion of Prior Art

In many electronic circuits, it is desirable to convert an analog sensor output from an analog signal to a digital signal prior to a desired signal processing operation. One prior art solution to convert an analog signal to a digital signal is by using a comparator to logically compare an electrical property of an analog signal input with another input signal such as a nominal desired threshold. This electrical property can be voltage, amperage, or the like. When the electrical property value of the analog signal input crosses the threshold, the output of the comparator transitions.

At times, background noise is superimposed on the analog signal input. This superposition can create various undesirable amplitude changes on the analog signal input. The background noise can add peaks and valleys to the amplitude of the analog signal input. As these amplitude variations pass through a comparator, the variations can frequently pass back and forth through the threshold level. This frequent amplitude transition across the threshold will also create a frequent transition in the comparator output signal and is often called bounce. This bounce characteristic is often undesirable, and a feedback circuit is sometimes used to control the bounce.

In order to eliminate some degree of bounce, a comparator may use hysteresis to limit the number of times the analog signal input effectively crosses the threshold. A nominal threshold is selected, in addition to an upper threshold and a lower threshold. The nominal threshold represents the amplitude where the desired output from the comparator is to change. The upper threshold is higher than the nominal threshold, and the comparator signal does not change until the analog signal input crosses the upper threshold. Similarly, the comparator output will not change again until the analog signal input drops below the lower threshold, which is below the nominal threshold. As a result, the hysteresis of the comparator is used to eliminate the spurious switches in comparator output created by the superimposed noise level on the analog signal input. The upper threshold and lower threshold are selected to minimize the bounce while maintaining an accurate comparator output relative to where the analog input signal crosses the nominal threshold.

The typical feedback circuit uses this application of hysteresis and a single comparator to evaluate when the analog signal input crosses the upper threshold level and the lower threshold level. After the analog signal input crosses the upper threshold, the feedback circuit will switch the comparator to use the lower threshold. However, in some situations, the analog signal input can initially cross the upper threshold and then cross below the upper threshold before the hysteresis is able to switch to the lower threshold. This situation creates spurious comparator output in the form of rapid fluctuation, or bounce. The bounce will foul the signal processing that occurs in subsequent circuit components. Additionally, this typical solution using a feedback circuit may have propagation delay which will generate an undesired phase shift in the resultant output waveform.

As such, there is a need for improvements in methods and circuits.

BRIEF DESCRIPTION OF THE INVENTION

The following presents a simplified summary of the invention in order to provide a basic understanding of some example aspects of the invention. This summary is not an extensive overview of the invention. Moreover, this summary is not intended to identify critical elements of the invention nor delineate the scope of the invention. The sole purpose of the summary is to present some concepts of the invention in simplified form as a prelude to the more detailed description that is presented later.

In accordance with an aspect, the present invention provides a method of electronic signal rectification. The method includes generating a variable amplitude input signal, determining an upper threshold level, and determining a lower threshold level. The method includes inputting the variable amplitude input signal and the upper threshold level into a first comparator. The method includes inputting the variable amplitude input signal and the lower threshold level into a second comparator. The method includes generating a first digital output signal in the first comparator using a hysteresis circuit and a second digital output signal in the second comparator using a hysteresis circuit. The method includes inputting the first digital output signal and the second digital output signal into a logic array. The method includes generating a digital level pulse output signal in the logic array that has a digital transition where the variable amplitude input signal passed through a threshold level.

In accordance with another aspect, the present invention provides a signal rectification and timing circuit for receiving a variable amplitude input signal and generating a digital level pulse output signal that transitions at the time the variable amplitude input signal passes through a threshold level. The rectification and timing circuit includes a first comparator for comparing the variable amplitude input signal and a determined upper threshold signal and producing a first digital output signal indicative of the comparison. The circuit includes a hysteresis circuit coupled to the first comparator. The circuit includes a second comparator for comparing the variable amplitude input signal and a determined lower threshold signal and producing a second digital output signal indicative of the comparison. The circuit includes a hysteresis circuit coupled to the second comparator. The circuit includes a logic array for receiving the first digital output signal and the second digital output signal and generating the digital level pulse output signal that transitions at the time the variable amplitude input signal passes through a threshold level.

BRIEF DESCRIPTION OF THE DRAWINGS

The foregoing and other aspects of the invention will become apparent to those skilled in the art to which the invention relates upon reading the following description with reference to the accompanying drawings, in which.

DETAILED DESCRIPTION OF THE INVENTION

Figure 1:
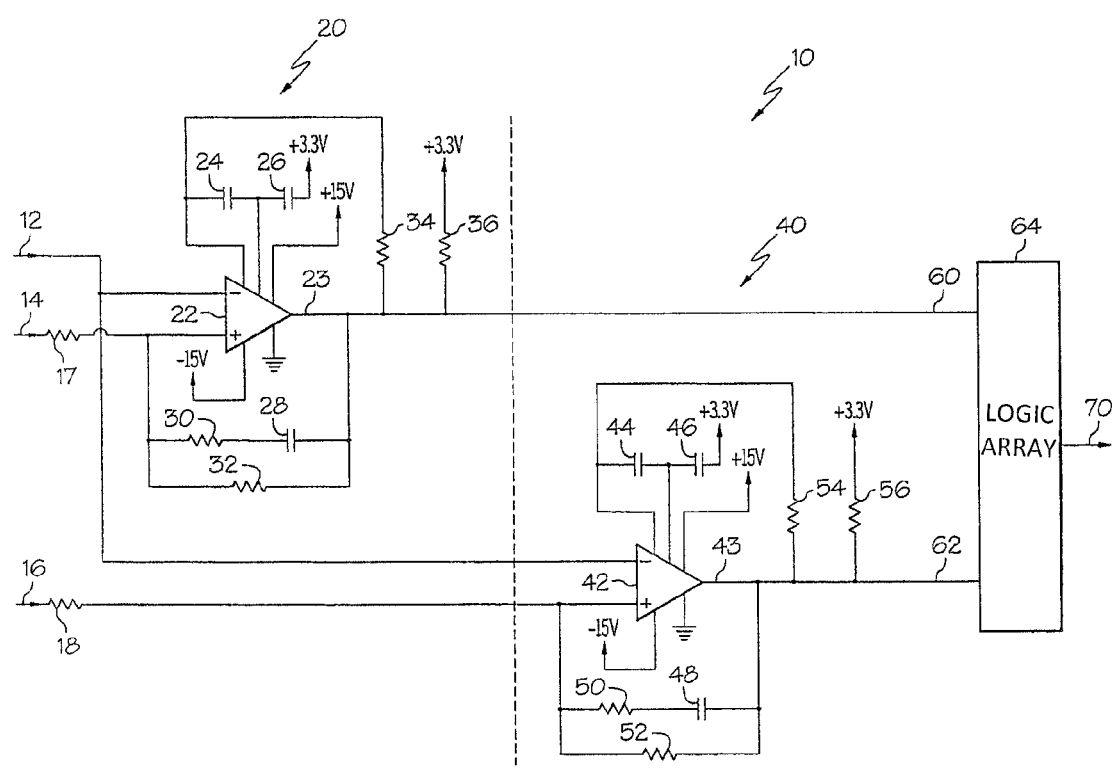
FIG. 1 is a block diagram illustrating an example of a signal rectification and timing circuit in accordance with an aspect of the invention.

Example embodiments that incorporate one or more aspects of the present invention are described and illustrated in the drawings. These illustrated examples are not intended to be a limitation on the present invention. For example, one or more aspects of the present invention can be utilized in other embodiments and even other types of devices. Moreover, certain terminology is used herein for convenience only and is not to be taken as a limitation on the present invention. Still further, in the drawings, the same reference numerals are employed for designating the same elements.

An example signal rectification and timing circuit is generally designated 10 within FIG. 1. It is to be appreciated that FIG. 1 merely shows one example and that other examples are contemplated within the present invention. The signal rectification and timing circuit 10 has a variable amplitude input signal 12. The variable amplitude input signal 12 can be the output of a common analog sensor (not shown). Analog sensors produce a change in an electrical property to indicate a change in its environment. The analog sensor output is a signal including changes in an electrical property corresponding to the changes in the sensor's environment. The electrical property can be a voltage, amperage, or the like. At times, it is desirable to convert the analog sensor output from an analog signal to a digital signal prior to a desired signal processing operation.

An upper threshold signal 14 and a lower threshold signal 16 are also inputs into the circuit. The upper threshold signal 14 passes through resistor 17 and the lower threshold signal 16 passes through resistor 18 prior to any signal processing. Resistors 17, 18 control the alternating current (AC) and direct current (DC) hysteresis around the comparators which are described below.

The signal rectification and timing circuit 10 is generally divided into two portions, the upper level threshold comparator side 20 and the lower level threshold comparator side 40. The upper level threshold comparator side 20 includes a first comparator 22. The first comparator 22 is chosen on the basis of being tolerant to the applied voltages in the signal rectification and timing circuit 10 and having adequate speed to condition the first digital output signal 23. The first comparator 22 includes inputs for the variable amplitude input signal 12 and the upper threshold signal 14. The first comparator 22 produces a first digital output signal 23 which represents the polarity of the difference between the amplitude of the upper threshold signal 14 and the variable amplitude input signal 12. The first digital output signal 23 is then used in a hysteresis circuit to limit the bounce of the first comparator 22.

The upper level threshold comparator side 20 also includes capacitor 24 and capacitor 26. Capacitors 24, 26 are chosen based upon the recommendations of the first comparator 22 manufacturer regarding effective construction of a hysteresis circuit and may not be necessary for all comparators. The upper level threshold comparator side 20 also includes capacitor 28 and resistor 30 which control the AC hysteresis around the first comparator 22 input. The upper level threshold comparator side 20 further includes resistor 32 which controls the DC hysteresis around the first comparator 22. Resistor 34 is chosen based upon the recommendation of the first comparator 22 manufacturer regarding effective construction of a hysteresis circuit and may not be necessary for all comparators. The upper level threshold comparator side 20 further includes resistor 36 which controls the speed of the rising edge of the first digital output signal 23.

The lower level threshold comparator side 40 includes a second comparator 42. The second comparator 42 is chosen on the basis of being tolerant to the applied voltages in the signal rectification and timing circuit 10 and having adequate speed to condition the second digital output signal 43. The second comparator 42 includes inputs for the variable amplitude input signal 12 and the lower threshold signal 16. The second comparator 42 produces a second digital output signal 43 which represents the polarity of the difference between the amplitude of the lower threshold signal 16 and the variable amplitude input signal 12. The second digital output signal 43 is then used in a hysteresis circuit to limit the bounce of the second comparator 42.

The lower level threshold comparator side 40 also includes capacitor 44 and capacitor 46. Capacitors 44, 46 are chosen based upon the recommendations of the second comparator 42 manufacturer regarding effective construction of a hysteresis circuit and may not be necessary for all comparators. The lower level threshold comparator side 40 also includes capacitor 48 and resistor 50 which control the AC hysteresis around the second comparator 42 input. The lower level threshold comparator side 40 further includes resistor 52 which controls the DC hysteresis around the second comparator 42. Resistor 54 is chosen based upon the recommendation of the second comparator 42 manufacturer regarding effective construction of a hysteresis circuit and may not be necessary for all comparators. The lower level threshold comparator side 40 further includes resistor 56 which controls the speed of the rising edge of the second digital output signal 43.

After the hysteresis process at the first comparator 22, the first digital output signal 23 becomes a first logic input signal 60. Similarly, after the hysteresis process at the second comparator 42, the second digital output signal 43 becomes a second logic input signal 62. The first logic input signal 60 and the second logic input signal 62 are inputs into a logic array 64. The logic array 64 combines the first logic input signal 60 and the second logic input signal 62 to form a digital level pulse output signal 70 which has a digital transition where the variable amplitude input signal 12 crossed a threshold. The transition may be precisely at the threshold cross. Within the shown example, the crossed threshold is the upper threshold level. It is to be appreciated that the threshold crossing may be one of the upper or lower threshold levels.

Some example component values for the circuitry of FIG. 1 include:
  Capacitor 24, 26, 44, 46=per the respective comparator's manufacturer recommendation, possibly not necessary for all comparators.
  Capacitor 28, 48=1 pF to 1000 pF
  Resistor 17, 18=0 to 100 kOhm
  Resistor 34, 54=per the respective comparator's manufacturer recommendation, possibly not necessary for all comparators.
  Resistor 30, 50=1 kOhm to 1 MOhm
  Resistor 32, 52=10 kOhm to 10 MOhm
  Resistor 36, 56=1 kOhm to 100 kOhm The signal rectification and timing circuit 10 eliminates the need for a feedback circuit that is typically used with a single comparator to compare a signal level to both an upper threshold signal 14 and a lower threshold signal 16. The present signal rectification and timing circuit 10 includes a first comparator 22 and a second comparator 42 which individually compare the variable amplitude input signal 12 to an upper threshold signal 14 and a lower threshold signal 16. The elimination of the feedback circuit decreases the propagation delay in the first digital output signal 23 and the second digital output signal 43. The decrease in the propagation delay enables the signal rectification and timing circuit 10 to reduce the phase error in the signal processing at the logic array 64.

Additionally, the elimination of a feedback circuit in the signal rectification and timing circuit 10 also eliminates the race condition when using a single comparator. The race condition is that in which an input signal crosses a desired threshold more than once before the feedback circuit is able to apply a new threshold value with hysteresis being applied to the comparator. As a result, the output signal of a comparator can have multiple undesired, rapidly occurring signal transitions. The signal rectification and timing circuit 10 eliminates the spurious conditioned signal transitions by using a single comparator for the upper threshold signal 14 and a single comparator for the lower threshold signal 16.

Other methods to create a digital level pulse output signal 70 having a digital transition precisely where a variable amplitude input signal 12 passed through a threshold level have been attempted. One method is to convert the variable amplitude input signal 12 to a digital signal at the initial portion of a circuit and then use digital signal processing to generate the transition points. This method is limited by current technology that does not support enough analog to digital conversion bandwidth with the necessary bit depth. Furthermore, this method is expensive and cumbersome to accomplish with tools such as firmware.

Figure 2:
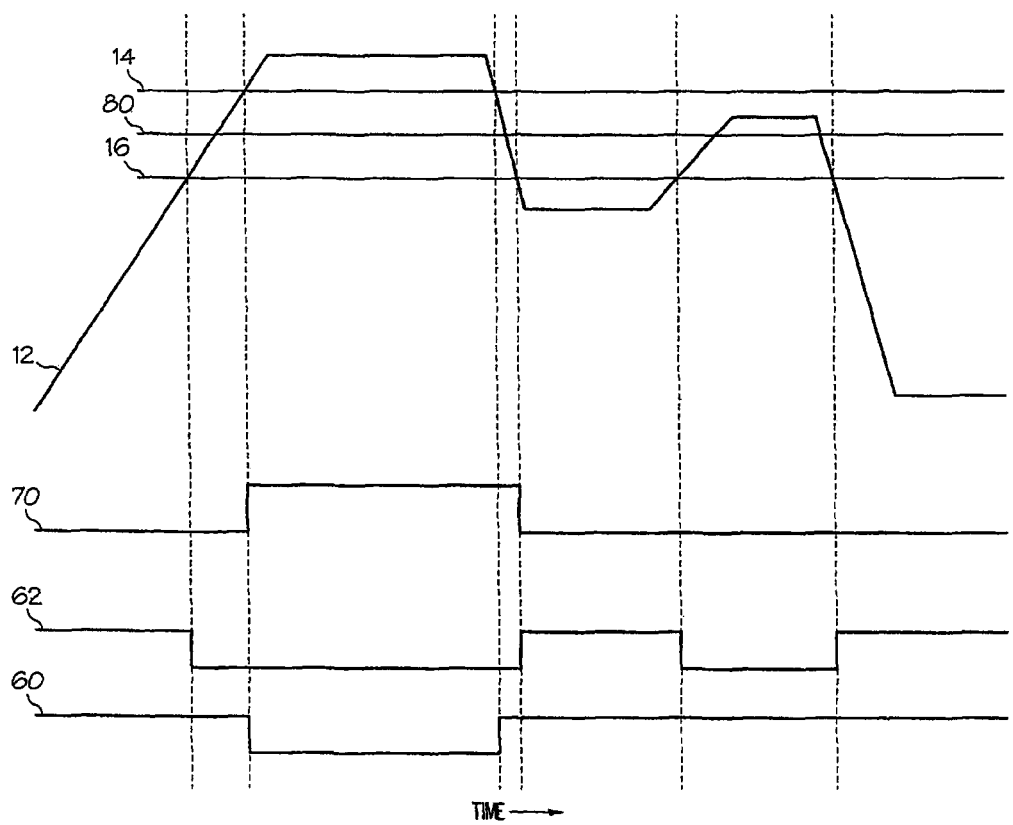
FIG. 2 is a graph illustrating the operation of the signal rectification and timing circuit of FIG. 1 including a variable amplitude input signal, the resultant output signals from two comparators, and the digital level pulse output signal.

Turning to FIG. 2, a graph representing example input signals and output of the signal rectification and timing circuit 10 is shown. The upper portion of the graph includes variable amplitude input signal 12 as it proceeds from left to right over time. As time proceeds, the variable amplitude input signal 12 crosses both the lower threshold signal 16 and the upper threshold signal 14. The nominal threshold 80 is also included in the upper portion of the graph. The lower portion of the graph includes the first logic input signal 60, the second logic input signal 62, and the digital level pulse output signal 70.

As the variable amplitude input signal 12 crosses the amplitude of the lower threshold signal 16, the second logic input signal 62 switches. This switch represents the result of the second comparator 42 operation. The switch occurs at the same time that the variable amplitude input signal 12 passed through the lower threshold signal 16. The variable amplitude input signal 12 then crosses the upper threshold signal 14 and this causes a switch in the first logic input signal 60. This switch also occurs at the same time that the variable amplitude input signal 12 passed through the upper threshold signal 14.

Similarly, the variable amplitude input signal 12 then crosses the upper threshold signal 14, causing a switch in the first logic input signal 60. The variable amplitude input signal 12 then crosses the lower threshold signal 16, causing a switch in the second logic input signal 62. The digital level pulse output signal 70 is generated by the logic array 64 as a combination of the first logic input signal 60 and the second logic input signal 62. Each of the switches in the digital level pulse output signal 70 occurs at the time that the variable amplitude input signal 12 crosses a threshold and there is minimal phase shift between the digital level pulse output signal and the variable amplitude input signal.

Figure 3:
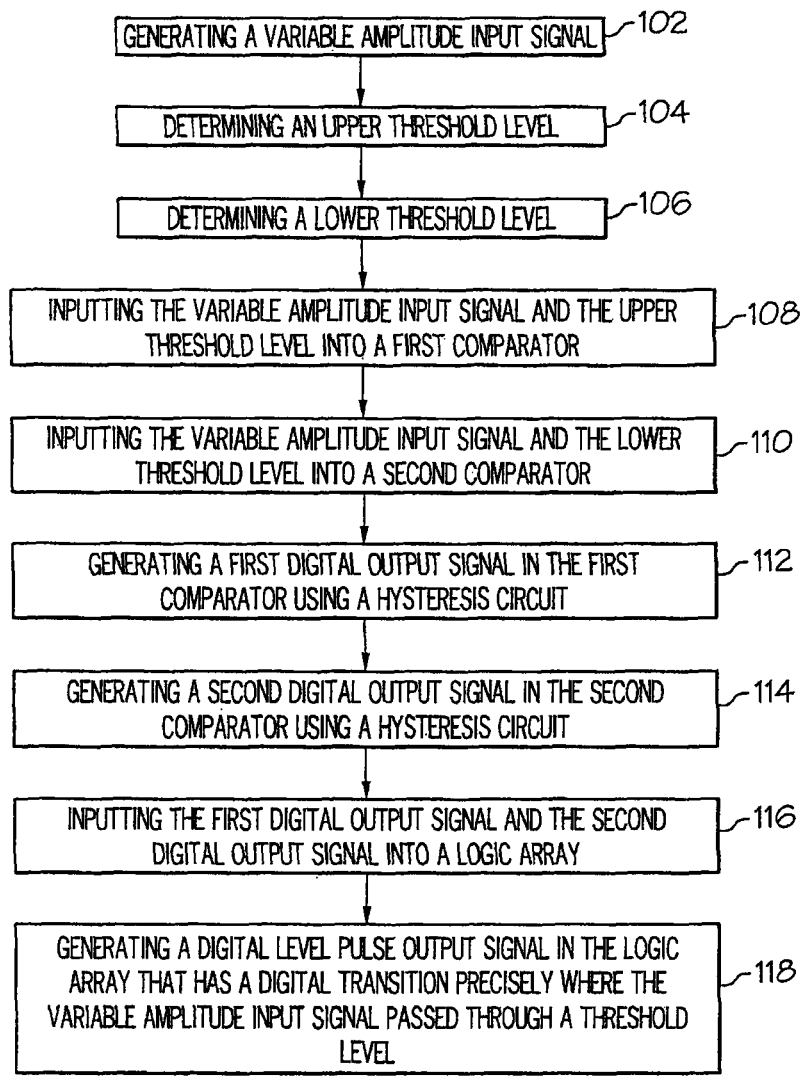
FIG. 3 is a top level flow diagram illustrating a method of operating a signal rectification and timing circuit in accordance with an aspect of the invention.

Turning to FIG. 3, a method of operating a comparator circuit is described. The method includes the step 102 of generating a variable amplitude input signal 12. The variable amplitude input signal 12 can be derived from any number of standard sensors including, but not limited to sensors detecting: electrical; magnetic; temperature; humidity; force; weight; torque; pressure; motion; vibration; flow; fluid level; fluid volume; light and infrared; or chemistry parameters. The variable amplitude signal input can also be a voltage output from any source.

The method also includes the step 104 of determining an upper threshold signal 14. The upper threshold signal 14 can be a voltage input from any source, and can be controlled by the operator of the signal rectification and timing circuit 10. The upper threshold signal 14 can be selected to optimize the range between the nominal threshold 80 and the upper threshold signal 14 while minimizing the bounce of the first digital output signal 23.

The method further includes the step 106 of determining a lower threshold signal 16. The lower threshold signal 16 can be a voltage input from any source, and can be controlled by the operator of the signal rectification and timing circuit 10. The lower threshold signal 16 can be selected to optimize the range between the nominal threshold 80 and the lower threshold signal 16 while minimizing the bounce of the second digital output signal 43.

The method still further includes the step 108 of inputting the variable amplitude input signal 12 and the upper threshold signal 14 into a first comparator 22. The method also includes the step 110 of inputting the variable amplitude input signal and the lower threshold signal 16 into a second comparator 42.

The method also includes the step 112 of generating a first digital output signal 23 in the first comparator 22 using a hysteresis circuit. The method further includes the step 114 of generating a second digital output signal 43 in the second comparator 42 using a hysteresis circuit.

The method includes the step 116 of inputting the first logic input signal 60 and the second logic input signal 62 into a logic array 64. The first logic input signal 60 and the second logic input signal 62 are the resulting signals from the first digital output signal 23 of the first comparator 22 and the second digital output signal 43 of the second comparator 42 after conditioning by the hysteresis circuits.

The method further includes the step 118 of generating a digital level pulse output signal 70 in the logic array 64 that has a digital transition where the variable amplitude input signal 12 passed through the amplitude of the upper threshold signal 14. The transition may be precisely at the threshold crossing.

The signal rectification and timing circuit method and apparatus is one solution to eliminate excess propagation delay error and excess signal phase shift in a resultant output waveform created by some circuits using a single comparator to condition a variable amplitude input signal with an upper threshold level and a lower threshold level. Additionally, the signal rectification and timing circuit method and apparatus reduces the cost of generating a digital level pulse output signal with a transition precisely where the amplitude of the variable amplitude input signal crossed a threshold. Furthermore, the signal rectification and timing circuit method and apparatus reduces the need for bandwidth while generating a digital level pulse output signal with a transition precisely where the amplitude of the variable amplitude input signal crossed a threshold.

The invention has been described with reference to the example embodiments described above. Modifications and alterations will occur to others upon a reading and understanding of this specification. Example embodiments incorporating one or more aspects of the invention are intended to include all such modifications and alterations insofar as they come within the scope of the appended claims.

What is claimed is:

1. A method of electronic signal rectification including the steps of:
   (a) generating a variable amplitude input signal;
   (b) determining an upper threshold level;
   (c) determining a lower threshold level;
   (d) inputting the variable amplitude input signal and the upper threshold level into a first comparator;
   (e) inputting the variable amplitude input signal and the lower threshold level into a second comparator;
   (f) generating a first digital output signal in the first comparator using a first, external hysteresis circuit, wherein the first digital output signal is utilized by the first hysteresis circuit;
   (g) generating a second digital output signal in the second comparator using a second, external hysteresis circuit, wherein the second digital output signal is utilized by the second hysteresis circuit;
   (f) inputting the first digital output signal and the second digital output signal into a logic array; and
   (g) generating a digital level pulse output signal in the logic array that has a digital transition where the variable amplitude input signal passed through one of the lower threshold and the upper threshold;
   the step of generating the first digital output signal in the first comparator using the first hysteresis circuit includes providing the first digital signal to the first comparator through a circuit containing a first capacitance and providing the first digital signal to the upper threshold level input into the first comparator circuit through a circuit containing a first resistance and a second capacitance.

2. The method according to claim 1, wherein the step providing the first digital signal to the first comparator through a circuit containing a first capacitance is such that the circuit containing a first capacitance also includes a resistance.

3. The method according to claim 1, wherein the step of generating the second digital output signal in the second comparator using the second hysteresis circuit includes providing the second digital signal to the second comparator through a circuit containing a third capacitance and providing the second digital signal to the lower threshold level input into the second comparator circuit through a circuit containing a second resistance and a fourth capacitance.

4. The method according to claim 3, wherein the step providing the second digital to the first comparator through a circuit containing a first capacitance is such that the circuit containing a third capacitance also includes a resistance.

5. A signal rectification and timing circuit for receiving a variable amplitude input signal and generating a digital level pulse output signal that transitions at the time the variable amplitude input signal passes through a threshold level, the rectification and timing circuit including:
   (a) a first comparator for comparing the variable amplitude input signal and a determined upper threshold signal and producing a first digital output signal indicative of the comparison;
   (b) a first, external hysteresis circuit coupled to the first comparator, wherein the first digital output signal is utilized by the first hysteresis circuit;
   (c) a second comparator for comparing the variable amplitude input signal and a determined lower threshold signal and producing a second digital output signal indicative of the comparison;
   (d) a second, external hysteresis circuit coupled to the second comparator, wherein the second digital output signal is utilized by the second hysteresis circuit; and
   (e) a logic array for receiving the first digital output signal and the second digital output signal and generating the digital level pulse output signal that transitions at the time the variable amplitude input signal passes through one of the lower threshold and the upper threshold;
   the first hysteresis circuit includes a first capacitance providing the first digital signal to the first comparator and containing a first resistance and a second capacitance providing the first digital signal to the upper threshold level input into the first comparator.

6. The rectification and timing circuit according to claim 5, wherein paired with the first capacitance is a resistance.

7. The rectification and timing circuit according to claim 5, wherein the second hysteresis circuit includes a third capacitance providing the first digital signal to the first comparator and containing a second resistance and a fourth capacitance providing the second digital signal to the upper threshold level input into the second comparator.

8. The rectification and timing circuit according to claim 7, wherein paired with the third capacitance is a resistance.

* * * * *